United States Patent [19]
Kapnias

[11] 3,735,211
[45] May 22, 1973

[54] SEMICONDUCTOR PACKAGE CONTAINING A DUAL EPOXY AND METAL SEAL BETWEEN A COVER AND A SUBSTRATE, AND METHOD FOR FORMING SAID SEAL

[75] Inventor: Demetrios E. Kapnias, Santa Clara, Calif.

[73] Assignee: Fairchild Camera and Instrument Corporation, Montain View, Calif.

[22] Filed: June 21, 1971

[21] Appl. No.: 155,174

[52] U.S. Cl.........317/234 R, 317/234 G, 317/234 H, 317/234 E, 174/52, 29/588
[51] Int. Cl...............................H01l 3/00, H01l 5/00
[58] Field of Search........................317/234 E, 234 F, 317/234 G, 234 H; 174/52; 29/471.9, 472.5, 472.9, 588, 590

[56] References Cited

UNITED STATES PATENTS 2,989,669 6/1961 Lathrop...............................317/234
3,234,437 2/1966 Dumas...............................317/234
3,628,105 12/1971 Sakai...................................317/234

OTHER PUBLICATIONS

IBM Technical Bulletin, Installation of Chips on Printed Circuit Cards, by Cameron et al. Vol. 11 No. 8 January 1969 page 971.

*Primary Examiner*—John W. Huckert
*Assistant Examiner*—Andrew J. James
*Attorney*—Roger S. Borovoy, Alan MacPherson and Charles L. Botsford

[57] ABSTRACT

A cover is hermetically sealed to a substrate by first joining the cover to the substrate by epoxy and then soldering the exposed edge of the cover to a metal film on the substrate to provide an hermetic seal. The epoxy prevents flux used during the soldering operation from entering the cavity formed between the cover and substrate and there degrading the performance of any semiconductor device placed in the cavity.

9 Claims, 4 Drawing Figures

INVENTOR.
DEMETRIOS E. KAPNIAS
BY
Alan H. MacPherson
ATTORNEY

Patented May 22, 1973

3,735,211

2 Sheets-Sheet 2

INVENTOR.
DEMETRIOS E. KAPNIAS
BY
Alan H. MacPherson
ATTORNEY

SEMICONDUCTOR PACKAGE CONTAINING A DUAL EPOXY AND METAL SEAL BETWEEN A COVER AND A SUBSTRATE, AND METHOD FOR FORMING SAID SEAL

BACKGROUND OF THE INVENTION

1. Field of the Invention

This invention relates to a package for hybrid circuits and in particular to such a package which is inexpensive but hermetic.

2. Prior Art

A wide variety of packages have been used to encapsulate semiconductor devices. In one common package, the semiconductor device is mounted in a cavity in a ceramic substrate. A sealing glass is placed on the substrate. Then a second ceramic part is placed over the semiconductor die and sealed to the bottom ceramic part, thereby to encapsulate the semiconductor chip. Other packages place a metal material around those regions of a substrate to which a package cover is to be attached. The cover is then soldered to the metal attached to the substrate to hermetically semiconductor chips placed on the substrate between the cover and the substrate.

One problem with a ceramic package is expense. A problem with a soldered package is that the flux used in soldering the cover to the substrate often penetrates into the cavity containing the semiconductor devices and eventually degrades the performance of these devices.

SUMMARY OF THE INVENTION

This invention overcomes the above problems associated with the prior art packages and provides an inexpensive package which can be hermetically sealed by solder but which at the same time prevents the flux used during soldering from entering the cavity containing the semiconductor dies.

According to this invention, a semiconductor package comprises a substrate on which semiconductor dies are mounted and to which a cover is attached, the cover being initially held onto the substrate by an epoxy. An hermetic seal between the cover and the underlying substrate is provided by soldering the external edge and surface of the cover to the substrate. The epoxy holding the cover to the substrate prevents the flux used during soldering from entering the cavity containing the die. The result is a clean, hermetically-sealed package.

In one embodiment of this invention, the leads from the semiconductor die within the cavity are connected to circuitry external to the cavity by metal conductors formed on the substrate beneath an insulating layer to which the epoxy is applied.

In another embodiment of this invention, the leads from the die are taken from the package by means of pins protruding through the bottom of the substrate and hermetically sealed to the substrate. The cover extends past, and is sealed to, the edge of the substrate by epoxy on the inside surface of the substrate adjacent the edge and by solder on the outside surface of the substrate adjacent the edge.

DESCRIPTIONS OF THE DRAWINGS

DETAILED DESCRIPTION

The package of this invention is particularly suited for holding large numbers of semiconductor die. Such die are used in what are called "hybrid" circuits, wherein a plurality of die are combined on one substrate to perform a particular circuit function. The techniques described in this specification can be used for packages of various shapes. They can also be easily adapted for custom requirements. The description of specific embodiments herein is not intended to limit the invention to cover only those embodiments but rather is for illustrative purposes only.

Figure 1:
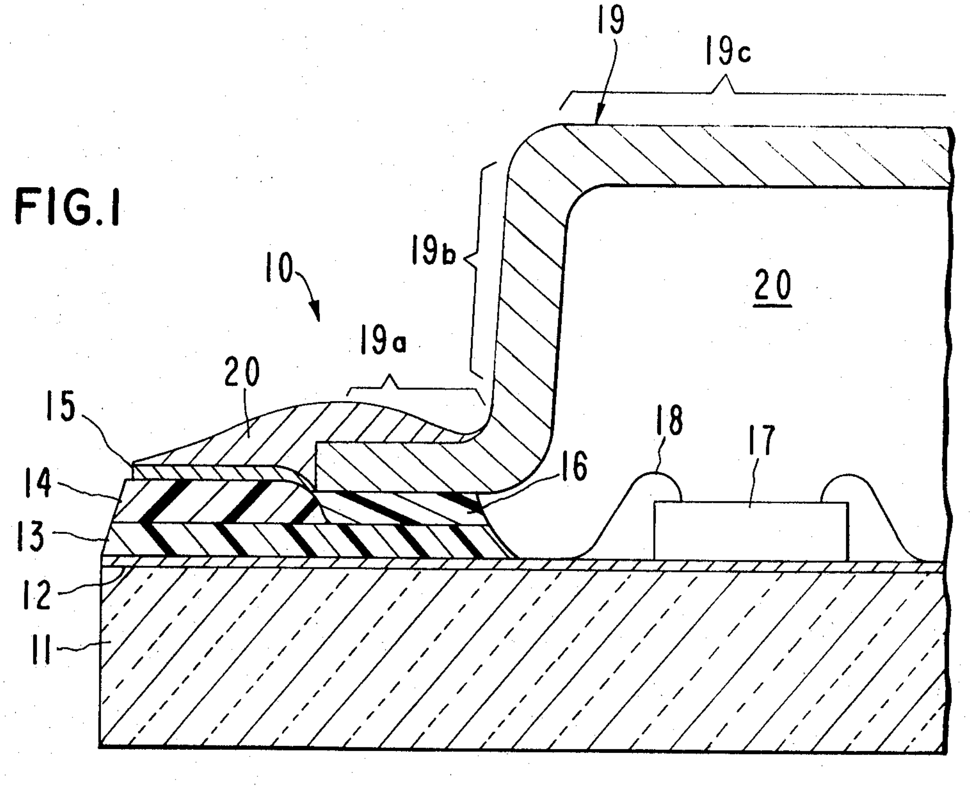
FIG. 1 shows in cross-section a portion of a package constructed according to the principles of this invention using both an epoxy and a solder seal.

As shown in FIG. 1 the basic package includes substrate 11 as an integral part. Typically substrate 11 is ceramic and might be, for example, aluminum oxide ($Al_2 0_3$). Metal layer 12 is formed on substrate 11. From layer 12 are formed the conductive paths which interconnect the circuit formed from semiconductor dice (such as die 17) mounted in cavity 20 to other external circuits. A first layer of dielectric 13 is next formed on metal pattern 12. Layer 13 is formed in a closed annular shape and assists in insulating conductive paths 12 from the package cover 19. Next, an epoxy preform 16 is placed on the inner portion of the top of dielectric layer 13. Preform 16 is also in a closed annular shape. It should be mentioned that the annular shape of dielectric 13 and epoxy 16 is typically rectangular or square. However, any variety of closed annular shapes can be used for preform 16 and this invention is not limited to these specific shapes. Epoxy 16, of a commercially available well-known material, is solid but firmly adhesive not only to dielectric layer 13 but also to the material from which cover 19 is formed.

Cover 19, generally box-shaped, comprises a flat portion 19*c* held above the surface of the substrate 11, by a portion 19*b* substantially angled with respect to, or even perpendicular to, flat portion 19*c*. The bottom end of portion 19*b* is bent outward to form a flange 19*a* in a plane parallel to but displaced from the plane containing top portion 19*c*. Essentially, cover 19 is dish shaped or box-shaped with a flange on its edge. This flange can, if desired, make an angle with the surface of substrate 11. The bottom surface of flange 19*a* is placed in contact with the top surface of epoxy 16.

If desired, a second layer of dielectric 14 is formed in a closed annular shape on the first layer 13 of dielectric outside the region occupied by epoxy 16. Over dielectric 14 is placed a metal which may be a compound, an alloy, or layers of selected metals. Typically, a platinum-gold alloy or a paladium-silver alloy is used for layer 15.

Next, a solder 20 is placed over middle layer 15 and along the outer surface of flange 19*a* of cover 19. Solder 20 can, for example, be a lead-tin solder or any other solder appropriate for use with the particular materials comprising cover 19 and layer 15. In forming the solder connections between cover 19 and layer 15 a flux is used. Epoxy 16 prevents flux from entering beneath flange 19*a* of package 19 into cavity 20. Thus, dice such as die 17 are kept clean and the flux does not degrade the performance of the encapsulated circuit. Soldering can be carried out using well-known wave-soldering techniques.

Use of solder 20 together with epoxy 16 provides an hermetic but inexpensive package. The low cost—typically compatible with that of plastic packages—and the hermetic sealing yield a particularly useful and advantageous package. The package allows a large number of semiconductor die 17 to be placed in cavity 20 and thus is of great use in achieving hybrid circuit design flexibility. The sealed package easily passes military grade hermeticity tests. Cover 19 is sealed to substrate 11 without significantly raising the internal temperature of the encapsulated semiconductor devices. No molten areas of the sealing material are formed inside the package. Such molten areas could—and did—in prior art packages short the circuits and interact with the circuit parts. The process by which the package is formed is highly controllable and simple. Finally, and importantly, this package concept is readily adaptable to a variety of package shapes and sizes.

Figure 2:
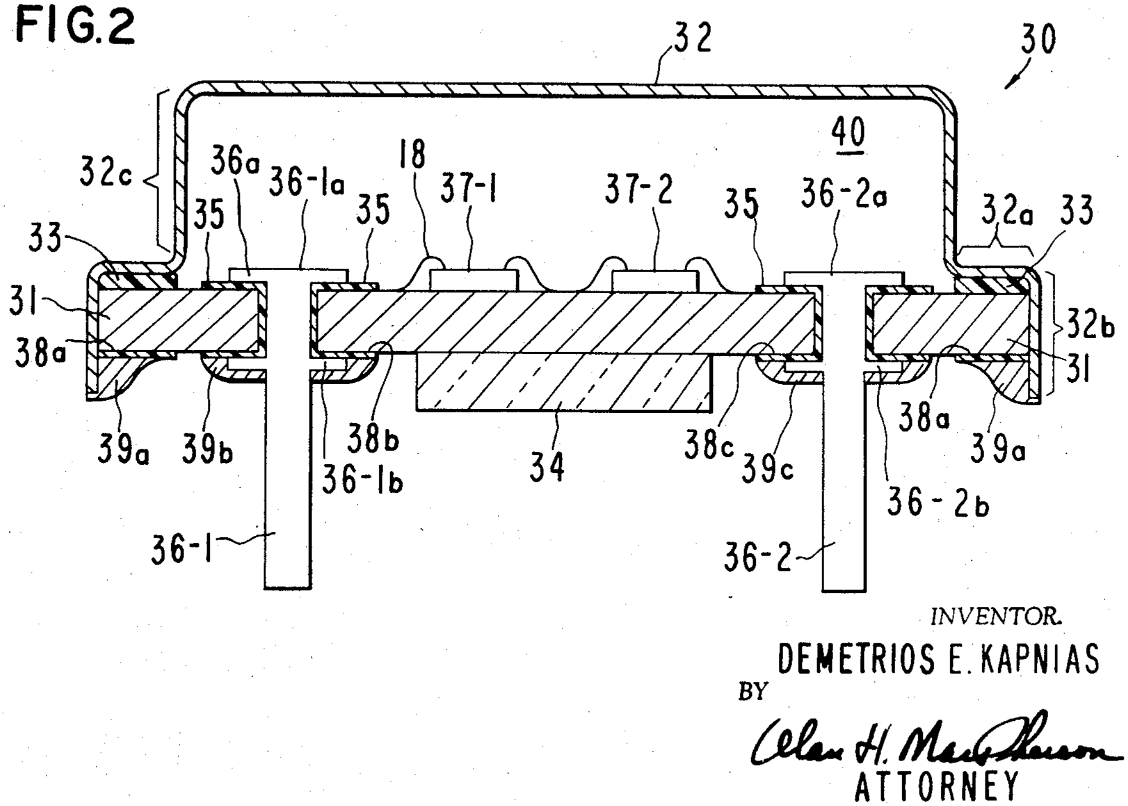
FIG. 2 shows in cross-section a second embodiment of the package of this invention using both an epoxy and solder seal.

FIG. 2 shows another package constructed in accordancc with this invention. Substrate 31 has placed around its edge on its top surface an epoxy preform 33. Preform 33 adheres to the surface of substrate 31 adjacent to its edge. A plurality of semiconductor dies 37 are placed on the surface of substrate 31. Dies 37-1 and 37-2 are shown. Contact pads (not shown) on the semiconductor die are connected by wires 18 to a metal interconnector pattern in turn connecting to pins 36. Shown in FIG. 2 are pins 36-1 and 36-2. Pins 36 protrude from the package through openings formed in substrate 31. Each pin 36 is sealed to the substrate by means of a metal layer 35 coating the surface of the opening through substrate 31. Each pin 36 adheres to metal 35 and metal 35 in turn adheres to substrate 31 thereby forming an hermetic seal. Typically pins 36 are copper and are placed in substrate 31 by thermoswedging. Flanges **36-1*b* and 36-2*b* are initially part of the pins and flanges 36-1*a* and 36-2*a* are produced by thermoswedging. The thick film metal layer 35 is typically 0.0006 to 0.001 inches thick although other thicknesses can be used. Metal 35** can be platinum-gold or paladium-silver, for example.

A lid or cover 32 is next placed on substrate 31. Cover 32 comprises a box shaped structure with a flange **32*a* running around the edge of the rim. Flange 32*a* contacts epoxy preform 33 all around substrate 31. Attached to flange 32*a* is an additional portion 32*b* substantially parallel to the sides 32*c* of the cover. Portions 32*b* are parallel to the edges of substrate 31** and extend beyond these edges for a reason which will be apparent shortly.

A metal layer **38*a* is placed on the bottom surface of substrate 31 adjacent to all edges of substrate 31. Metal layer 38*a* terminates at the edge of substrate 31. Preferably, the outer portion 32*b* of lid 32 tightly fits over the edges of substrate 31. Metal layers 38*b* and 38*c* are shown surrounding the holes through which pins 36-1 and 36-2 extend. Metal layers 38*a*, 38*b* and 38*c*** are not in contact with each other.

Solder **39*a* is placed around the edge of substrate 31 contacting metal 38*a* and the bottom portion of rim 32*b* of cover 32. In addition, solder 39*b* and 39*c* is placed around pins 36-1 and 36-2 adjacent to the exposed portions of these pins and in contact with metal 38*b* and 38*c*. Solder 39*b* and 39*c* hermetically seals these pins to substrate 31. Solder 39*a*, 39*b* and 39*c*** can be placed on the package by well-known wave-soldering techniques. The solder remains only on those surfaces it wets.

A block 34 of ceramic can, if desired, be placed on the bottom of the package, as shown, to function as a standoff to prevent the package from being pushed flush with the mounting.

The epoxy seal 33 prevents flux from the soldering operation from entering the package during the soldering or thereafter. This keeps the interior body of the package clean and prevents degradation of the characteristics of the semiconductor die mounted therein with time.

One advantage of the sealing technique used with the structure shown in FIG. 2 is that unevennesses in the surfaces of substrate 31 and in the flange **32*a* of the cover do not result in void spaces through which air and contaminants can travel. In addition, in the structure shown in FIG. 2, solder 39*a*, 39*b* and 39*c* maintains a uniform composition and thickness and does not have a thickness which varies in response to the pressure placed on the cover during the soldering operation. The remaining advantages associated with the structure in FIG. 2 are the same as the advantages associated with the structure of FIG. 1**

Figure 3A:
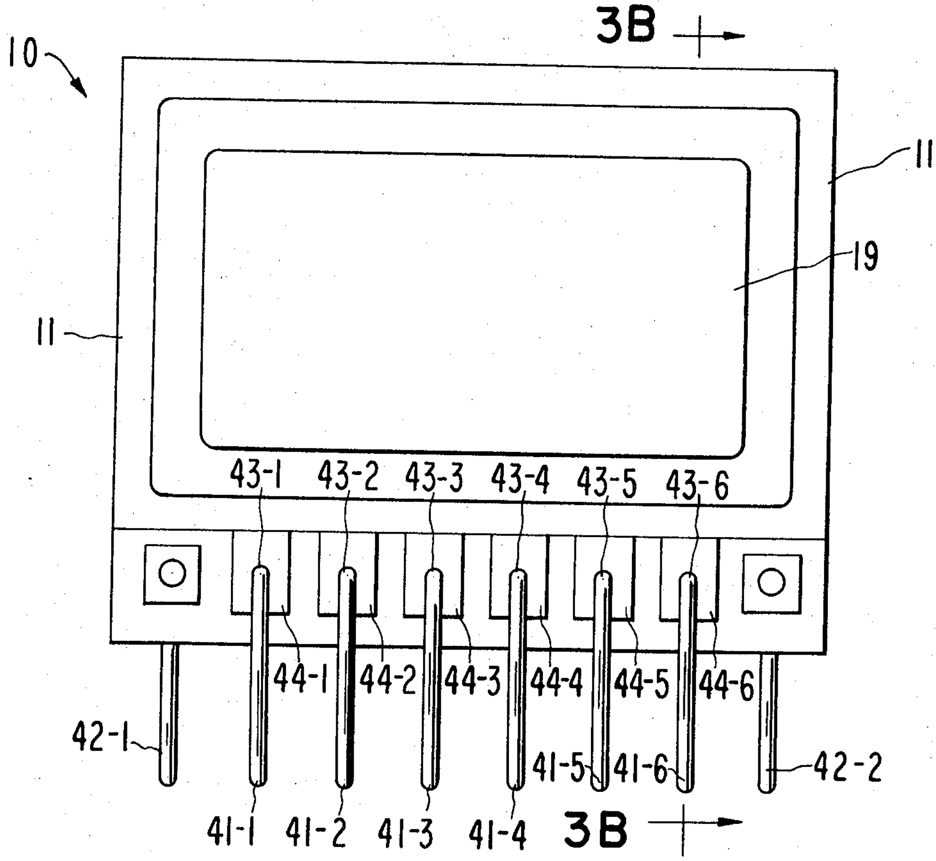
FIGS. 3*a* and 3*b* show plan and end views of one package of this invention suitable for holding a plurality of semiconductor die.
Figure 3B:
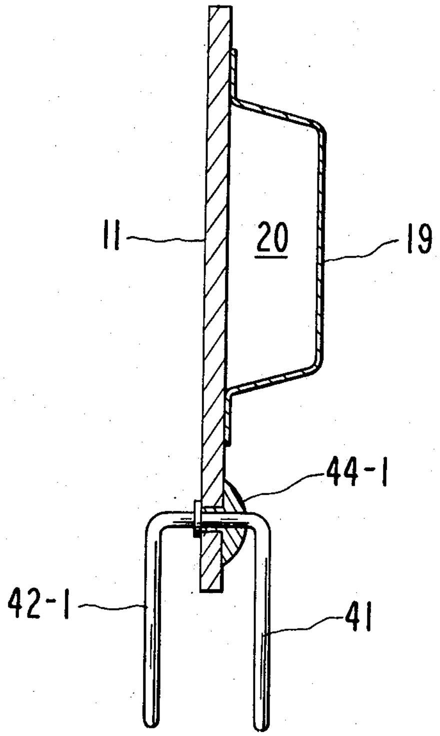

FIG. **3*a* shows a plan view of one possible embodiment of the structure of FIG. 1. Shown in FIG. 3*a* are contact pins 41-1 through 41-6 swedged through holes 43-1 through 43-6 in ceramic 11. Solder 44-1 through 44-6 is then formed around holes 43-1 through 43-6 to firmly hold pins 41-1 through 41-6 in their holes. Solder 44 contacts a metal lead (not shown in FIGS. 3*a* and 3*b*) extending from cavity 20 (FIG. 3*b*) under the flange of cover 19 into contact with solder 44-1. Thus, pins 41-1 through 41-6 together with supports 42-1 and 42-2 allow the package 10** to be plugged edgewise into a connector. This allows a large number of packages to be densely mounted in one assembly.

A typical epoxy appropriate for use in this invention is obtained from Ableteck Division of Ablestik Laboratories, 544 West 182nd Street, Gardena, Calif. and is designated Ablestik No. 517. Other functionally similar epoxys are also suitable for use with this invention.

What is claimed is:

1. Structure which comprises:

a substrate;

a cover sealed to said substrate with a void between said cover and said substrate; the seal between said cover and said substrate comprising;

an annular-shaped epoxy preform between said substrate and said cover sealing said cover to said substrate; and solder adherent to said cover and said substrate, said annular-shaped epoxy preform occupying a space between said solder and the void formed between said cover and said substrate to thereby prevent solder flux from entering said void.

2. Structure as in claim 1 wherein said substrate comprises:

a ceramic material containing a top and a bottom surface;

an annular-shaped dielectric formed over selected portions of said top surface; and an annular-shaped metal layer placed on said annular-shaped dielectric, said annular-shaped metal layer being larger than said annular-shaped epoxy preform.

3. Structure as in claim 2 wherein said annular-shaped dielectric layer comprises a first annular-shaped dielectric layer containing on its exposed surface a second annular-shaped dielectric layer.

4. Structure as in claim 1 wherein said annular-shaped metal layer comprises an alloy selected from the group consisting of platinum-gold and paladium-silver.

5. Structure as in claim 4 wherein said solder comprises a lead-tin solder.

6. Structure as in claim 1 wherein said epoxy preform is on the top surface of said substrate on the same side of said substrate as is said void, and adjacent the edge of said substrate, and said solder is on the bottom surface of said substrate adjacent the edge of said substrate sealing an extension of the edge of said cover to the bottom surface of said substrate.

7. Structure as in claim 1 wherein said epoxy is on the same side of said substrate as is the void between said cover and said substrate and said solder is on the outer surface of said cover and said substrate on the same side of said substrate as is said void.

8. Structure as in claim 1 wherein said substrate comprises;

a ceramic plate with a metal pattern on one side of said ceramic plate;

a first annular-shaped dielectric layer over said metal pattern surrounding the area on said substrate to which semiconductor die are to be bonded;

an annular-shaped epoxy preform adherent to said first annular dielectric layer on the inner surface of said first annular-shaped dielectric layer;

a second annular-shaped dielectric layer adherent to said first dielectric layer adhacent to said first annular-shaped epoxy preform but outside said annular-shaped epoxy preform;

a film of metal adherent to the second annular-shaped dielectric layer;

a cover the edge of which is adherent to said annular-shaped epoxy preform; and solder adherent to said film of metal and the outer edge of said cover.

9. The method of forming a semiconductor package which comprises:

forming a layer of metallization on a ceramic substrate;

forming an annular-shaped dielectric layer on said substrate surrounding the area on which semiconductor die are to be placed on said substrate;

forming an annular-shaped film of metal on the outer surface of said annular-shaped dielectric layer;

forming an annular-shaped epoxy preform on the inner surface of said first annular-shaped dielectric layer;

placing a cover on said annular-shaped epoxy preform; and soldering said cover to said film of metal.

* * * * *